(12) United States Patent
Ogawa

(10) Patent No.: US 8,770,410 B2
(45) Date of Patent: Jul. 8, 2014

(54) SUBSTRATE STORAGE CONTAINER

(75) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 8 days.

(21) Appl. No.: 13/582,167

(22) PCT Filed: Feb. 24, 2011

(86) PCT No.: PCT/JP2011/054068
§ 371 (c)(1),
(2), (4) Date: Aug. 31, 2012

(87) PCT Pub. No.: WO2011/108424
PCT Pub. Date: Sep. 9, 2011

(65) Prior Publication Data
US 2012/0325707 A1    Dec. 27, 2012

(30) Foreign Application Priority Data

Mar. 4, 2010 (JP) .................... 2010-047477

(51) Int. Cl.
*B65D 85/30* (2006.01)
(52) U.S. Cl.
USPC .......................... 206/710; 206/454
(58) Field of Classification Search
USPC ......................... 206/454, 710–712
See application file for complete search history.

(56) References Cited

U.S. PATENT DOCUMENTS

| | | | | |
|---|---|---|---|---|
| 6,382,419 | B1* | 5/2002 | Fujimori et al. | 206/454 |
| 7,357,257 | B2* | 4/2008 | Matsutori et al. | 206/710 |
| 7,383,955 | B2* | 6/2008 | Matsutori et al. | 206/711 |
| 7,497,333 | B2* | 3/2009 | Matsutori et al. | 206/711 |
| 7,520,388 | B2* | 4/2009 | Matsutori et al. | 206/711 |
| 2002/0020650 | A1* | 2/2002 | Fujimori et al. | 206/454 |

FOREIGN PATENT DOCUMENTS

| | | |
|---|---|---|
| JP | 5-45208 U | 6/1993 |
| JP | 7-54645 Y2 | 12/1995 |
| JP | 11-91864 A | 4/1999 |
| JP | 2000-306988 A | 11/2000 |
| JP | 2005-48891 A | 2/2005 |
| JP | 2008-34879 A | 2/2008 |

OTHER PUBLICATIONS

International Search Report from PCT/JP2011/054068 mailed on May 17, 2011 (2 pages).

* cited by examiner

*Primary Examiner* — Bryon Gehman
(74) *Attorney, Agent, or Firm* — Osha Liang LLP

(57) ABSTRACT

A substrate storage container includes an attachment structure in a container body for storing substrates so that a transport component is removably attached to the attachment structure. The attachment structure includes a supporting rail portion provided on an outer wall of the container body, a guide piece provided on the outer wall of the container body, and an engagement part formed with the guide piece. A forked portion formed of a combination of the guide piece and the engagement part. The transport component includes a hollowed frame-shape main part member supported by the supporting rail portion of the attachment structure.

6 Claims, 10 Drawing Sheets

SUBSTRATE STORAGE CONTAINER

TECHNICAL FIELD

The present invention relates to a substrate storage container used for storage, preservation, transportation, shipment and other handling of substrates such as semiconductor wafers, glass wafers, glass masks and the like.

BACKGROUND ART

Though not illustrated, a conventional substrate storage container includes a front open box type container body for storing a plurality of semiconductor wafers arranged vertically in order and a door for opening and closing the open front of this container body, the container body including attachment structures to which transport components for transportation are removably attached. The substrate storage container is used for storage, preservation, transportation and shipment of semiconductor wafers (see patent documents 1 and 2).

Attachment structures are integrally formed on the outer wall of the container body, specifically, the roof and both sidewalls of the container body. Such an attachment structure includes a pair of supporting rails opposing each other, arranged on the outer wall of the container body. Formed near the pair of supporting rails are an engagement part and engagement rib for transport component. This attachment structure is configured so that the paired supporting rails nip the transport component therebetween and the engagement part and engagement rib engage and fix the nipped transport component.

The transport components include a robotic flange that is removably attached to the roof of the container body by means of an attachment structure and is held by transport equipment; and a pair of manual handles that are removably attached to both sidewalls of the container body via attachment structures and manually operated. These transport components are formed of polycarbonate or the like having high rigidity in view of securely supporting the substrate storage container full of plural semiconductor wafers (about 7 kg mass when set with full of semiconductor wafers).

The transport component includes, for example a plate-like base that is held between a pair of supporting rails of the attachment structure. This base is formed with a supporting pillar that is projected approximately upright. This supporting pillar is formed with a flange to be gripped or a handle portion at the end. Integrally formed with the base of the transport component is a hooking part that deforms and engages with the engaging rib of the attachment structure to prevent backward motion.

PRIOR ART DOCUMENTS

Patent Documents

Patent Document 1:
Japanese Patent Application Laid-open 2000-306988
Patent Document 2:
Japanese Patent Application Laid-open 2008-34879

SUMMARY OF THE INVENTION

Problems to be Solved by the Invention

Thus, in the conventional substrate storage container, the transport components are formed of a high rigidity molding material such as polycarbonate or the like, and the hooking part for preventing backward motion is integrally formed with the base of the transport component, it is hence impossible to impart high elasticity to the hooking part. Accordingly, when the hooking part is engaged with the engagement rib of the attachment structure, a strong external force has to be applied to the hooking part so as to deform it by force to complete engagement, giving rise to a poor workability problem. Further, also when the hooking part is removed from the engagement rib of the attachment structure, it is necessary to apply a strong external force to the hooking part to deform it, hence there is a fear that the workability cannot not be improved.

Further, when the hooking part is attached and removed a multiple number of times, the hooking part deforms so as not to be able to keep up high enough engagement strength, hence there occurs a fear that the hooking part is prone to come out of the engagement rib. In addition, when the place of engagement between the engagement rib and the hooking part resides on the underside of the transport component, it becomes difficult to operate, leading to poor working performance and operativity.

Further, when the container body of the substrate storage container is used or reused by washing it with rinsing water of the washing bath, the supporting rails, engagement parts, engagement ribs of the attachment structure are given in a so-called dead end structure, rinsing water is prone to remain; to make the matters worse, drying air is poorly circulated, requiring long time to dry. If rinsing water is left in the container body, there are fears that traces of waterdrops are left over and that volatile organic gases arise from the molding material that forms the container body, adhere to the semiconductor wafers in storage and form salts of organic compounds, yielding staining and the cause of corrosion.

The present invention has been devised in view of the above, it is therefore an object of the present invention to provide a substrate storage container which enables improvement in workability in attachment work of a transport component to an attachment structure of its container body, can eliminate the risk of the transport component being likely to come off from the attachment structure, and can prevent liquids such as rinsing water and the like from remaining in the attachment structure and transport component.

Means for Solving the Problems

In order to solve the above problems in the present embodiment, in order to solve the above problems in the present embodiment, a substrate storage container has an attachment structure in a container body for storing substrates so that a transport component is removably attached to the attachment structure, and is characterized in that the attachment structure includes: a supporting rail portion provided on the outer wall of the container body; a guide piece provided on the outer wall of the container body; and an interference/engagement part formed with the guide piece, forming a forked portion in the front of the combination of the guide piece and the interference/engagement part, and the transport component includes a main part member supported by the supporting rail portion of the attachment structure, and the main part member is formed with a circulation hole for fluids and an elastic engagement piece to be guided by the guide piece of the attachment structure, the elastic engagement piece being made to interfere with the forked portion of the guide piece and the interference/engagement part of the attachment structure.

Here, it is preferred that the attachment structure is provided on the outer wall of the container body and includes a stopper that engages the transport component.

It is also possible to provide a configuration in which the container body is given as a front open box configuration having an open front, the guide piece of the attachment structure is oriented in the front-to-rear direction of the container body and formed with the interference/engagement part on the side surface thereof while the guide piece is inclined in the direction crossing the front-to-rear direction of the container body, and the elastic engagement piece of the transport component is formed to be flexible so as to flex and come into contact with the guide piece of the attachment structure, the elastic engagement piece being formed with a projected portion that interferes with the interference/engagement part of the attachment structure.

It is also possible to provide a configuration in which a plurality of supporting rail portions are provided for the attachment structure so as to oppose to each other, the opposing multiple supporting rail portions are each inclined so that the distance between the supporting rail portions becomes shorter from the rear to front of the container body, and the guide piece of the attachment structure is provided between the multiple supporting rail portions so as to be inclined to the center line with respect to the lateral direction of the container body, and, the main part member of the transport component is made hollow so as to incorporate the elastic engagement piece therein, nipped plates to be held between multiple supporting rail portions of the attachment structure are formed on both sides of the main part member, the side surface of each nipped plate is inclined so as to fit along the inclination of the supporting rail portion while a flange is formed on the top of the main part member, the flange being provided with an operational opening through which the elastic engagement piece is exposed, and a circulation opening for fluids is provided for, at least, either one of multiple nipped plates and the flange.

It is also possible to provide a configuration in which a plurality of supporting rail portions are provided for the attachment structure so as to oppose to each other, the opposing multiple supporting rail portions are each inclined so that the distance between the supporting rail portions becomes shorter from the rear to front of the container body, and the guide piece of the attachment structure is provided between the multiple supporting rail portions so as to be inclined to the vertical direction of the container body, and the main part member of the transport component is shaped into an approximately trapezoidal plate having both lateral sides inclined so as to fit along the inclination of the supporting rail portions while an elastic engagement piece is formed in the underside of the main part member, and an operational opening is provided for the main part member to expose the elastic engagement piece.

It is also possible to provide a configuration in which an indented portion that defines a clearance with the outer wall of the container body is formed on the underside of, at least, either one of the main part member and the nipped plate, and the main part member is formed with a deformation restrainer for limiting excessive deformation of the elastic engagement piece due to contact with the guide piece of the attachment structure.

Here, the substrates defined in the scope of the claims may at least include a single or a plurality of semiconductor wafers (silicon wafers with 200 mm, 300 mm and 450 mm in diameter), glass wafers, glass masks and the like. The container body may be made transparent, opaque, translucent or the like. The outer wall of this container body includes at least, the roof, backside wall, sidewalls, etc., of the container body. The guide piece and interference/engagement part of the attachment structure are combined in an approximately Y-shape, λ-shape, v-shape or a shape similar to these. The guide piece can be provided near or around the supporting rail portions.

The transport components, at least, include a robotic flange that is removably attached to the roof of the container body and is held by a transport system, a manual handle that is removably attached to the sidewall of the container body and is manually operated, a side rail that is removably attached to the lower part of the sidewall of the container body and is used at the time of transportation, and the like.

The main part member of the transport component may be formed with an elastic engagement piece via a reinforcing rib. This reinforcing rib and the elastic engagement piece are opposed to each other with a gap therebetween, whereby excessive flexion of the elastic engagement piece can be restrained by means of the reinforcing rib. The main part member may be formed with a single or plurality of circulation openings and elastic engagement pieces. Further, the fluids at least include various kinds of liquids (e.g., rinsing water, pure water, etc.) and gases (e.g., air, inert gases, etc.).

According to the present invention, when the transport component is attached to the attachment structure of the outer wall of the container body, the transport component is supported by the supporting rail portions of the attachment structure. At this stage, the elastic engagement piece of the transport component comes in contact with, and is guided by, the guide piece of the attachment structure, and the elastic engagement piece interferes with the forked portion between the guide piece and the interference/engagement part, or the interference/engagement part. As the elastic engagement piece interferes with the interference/engagement part, the elastic engagement piece reverts back to the original state, whereby the transport component can be attached to the attachment structure of the container body.

Further, when fluids such as liquids, gases, etc., are used, the fluids are smoothly circulated inside and outside the main part member, to thereby improve operativity of cleansing and drying work of the transport component.

Effect of the Invention

According to the present invention, it is possible to improve operativity in attaching the transport component to the attachment structure of the container body and eliminate the risk of the transport component being likely to come off from the attachment structure. It is also possible to prevent liquids such as rinsing water etc., from remaining in the attachment structure and/or the transport component.

According to the present invention defined in claim 2, since the stopper touches and engages the transport component, it is possible to effectively prevent excessive sliding, positional displacement, backlashing, etc. of the transport component relative to the container body.

According to the present invention defined in claim 3, the elastic engagement piece of the transport component is put into contact with the inclined guide piece of the attachment structure so that the transport component can be appropriately guided by deforming the elastic engagement piece. Further, after flexion an deformation of the elastic engagement piece, the projected portion of the elastic engagement piece passes over the guide piece by repulsive force of the elastic engagement piece and is made to interfere with the forked portion between the guide piece and the interference/engagement part, it is possible to firmly attach transport component to the outer wall of the container body.

According to the present invention defined in claim 4 or 5, since multiple supporting rails of the attachment structure are inclined in the front-to-rear direction of the container body, it is possible to prevent positional displacement and backlashing of the transport component relative to the container body with a simple configuration. It is hence possible to appropriately slide the transport component to the predetermined position. Further, since the lateral sides of the transport component or the nipped plates are also inclined correspondingly to the inclination of the supporting rails, there is less risk of the transport component being set in a wrong orientation. Further, since the flange and the transport component are provided with operational openings to expose the elastic engagement pieces, it is possible to easily operate the elastic engagement pieces, regardless of the positions of the elastic engagement pieces.

According to the present invention defined in claim 6, since the gaps defined by the indented portions enable smooth circulation of fluids without causing any stagnation, it is possible prevent liquids such as rinsing water etc., from being left over in the transport component. Further, provision of the deformation restrainer can effectively eliminate the risk of the elastic engagement piece being excessively deformed and damaged and the risk of the elastic engagement piece being excessively deformed and becoming unable to keep high enough engagement force.

BEST MODE FOR CARRYING OUT THE INVENTION

Now, an embodiment of the present invention will be described with reference to the drawings. As shown in FIGS. 1 to 9, a substrate storage container of the present embodiment includes: a container body 1 for storing semiconductor wafers and a removable door 10 that opens and closes the open front of this container body 1, the container body 1 being provided on its outer wall with attachment structures 20 to which transport components 30 for transportation are removably attached.

Semiconductor wafer W is a silicon wafer with a diameter of, for example 300 mm, and a plurality of semiconductor wafers are stored horizontally in order into container body 1, arranged from top to bottom, and are successively taken out by means of a dedicated handling robot.

Container body 1 and door 10 are assembled using a plurality of parts that are individually formed by injection molding of molding materials including predetermined resins. Examples of the predetermined resins of the molding materials include polycarbonate, polyetheretherketone, polyetherimide, polybutylene terephthalate, polyacetal, liquid crystal polymer, cycloolefin resin, etc., which are excellent in mechanical properties, heat resistance and the like. The predetermined resin may be optionally added with carbon, carbon fiber, metal fiber, carbon nanotubes, conductive polymers, antistatic agent, flame retardant and the like, as required.

Figure 1:
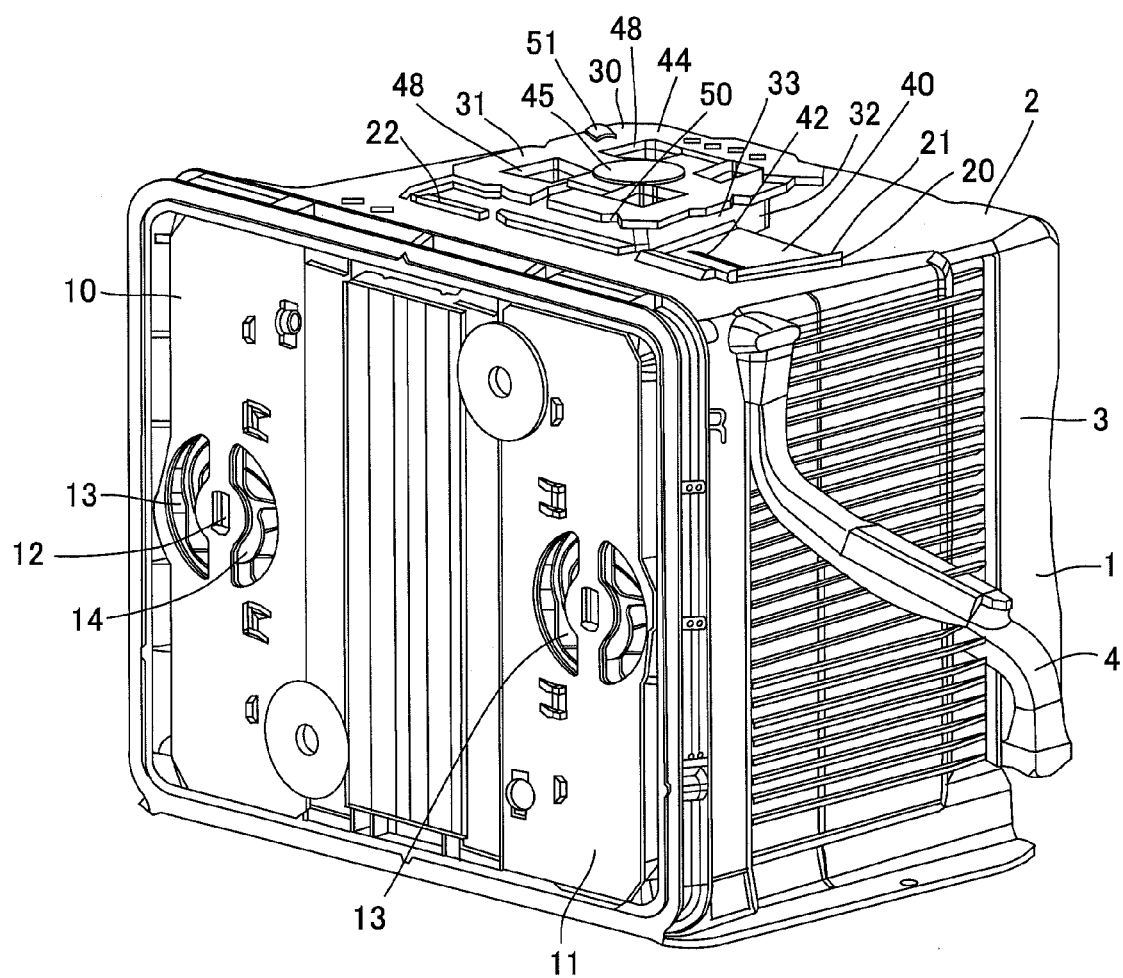
FIG. 1 is an overall illustrative perspective view schematically showing an embodiment of a substrate storage container according to the present invention.
Figure 2:
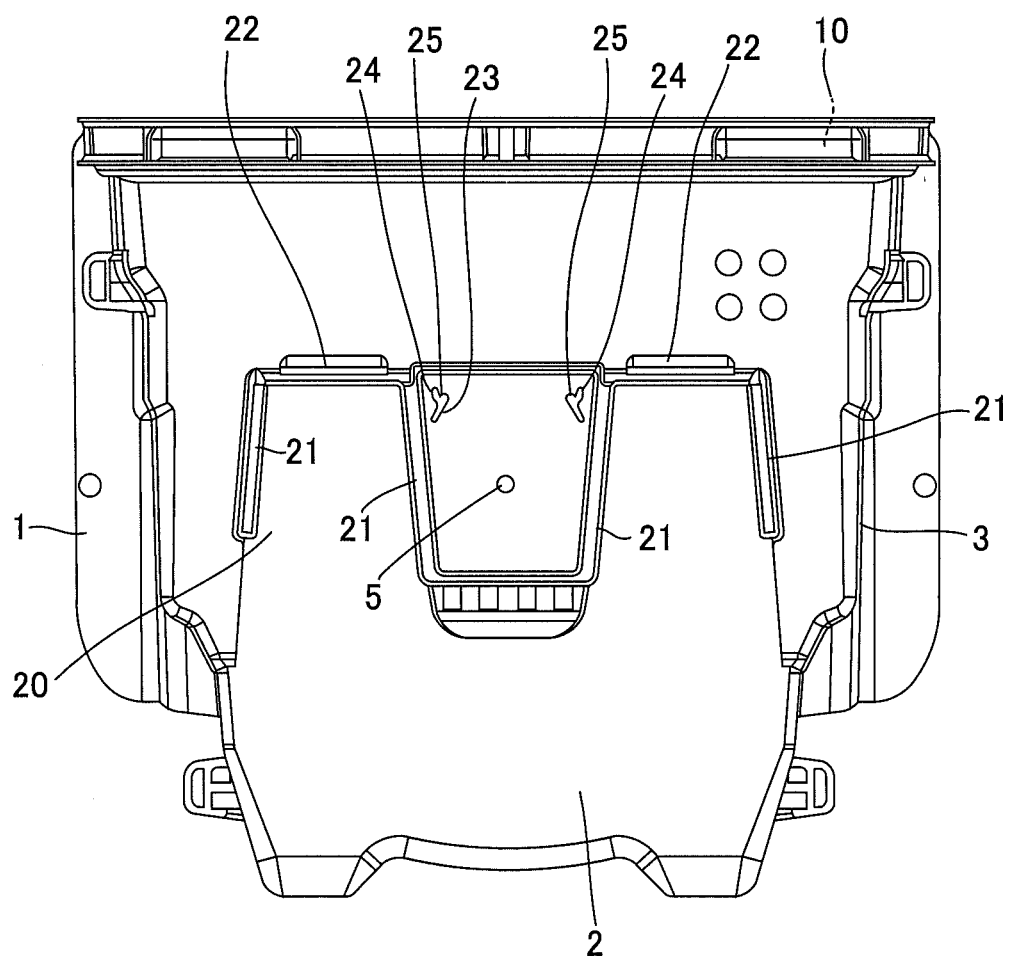
FIG. 2 is an illustrative plan view schematically showing an attachment structure in the embodiment of a substrate storage container according to the present invention.
Figure 3:
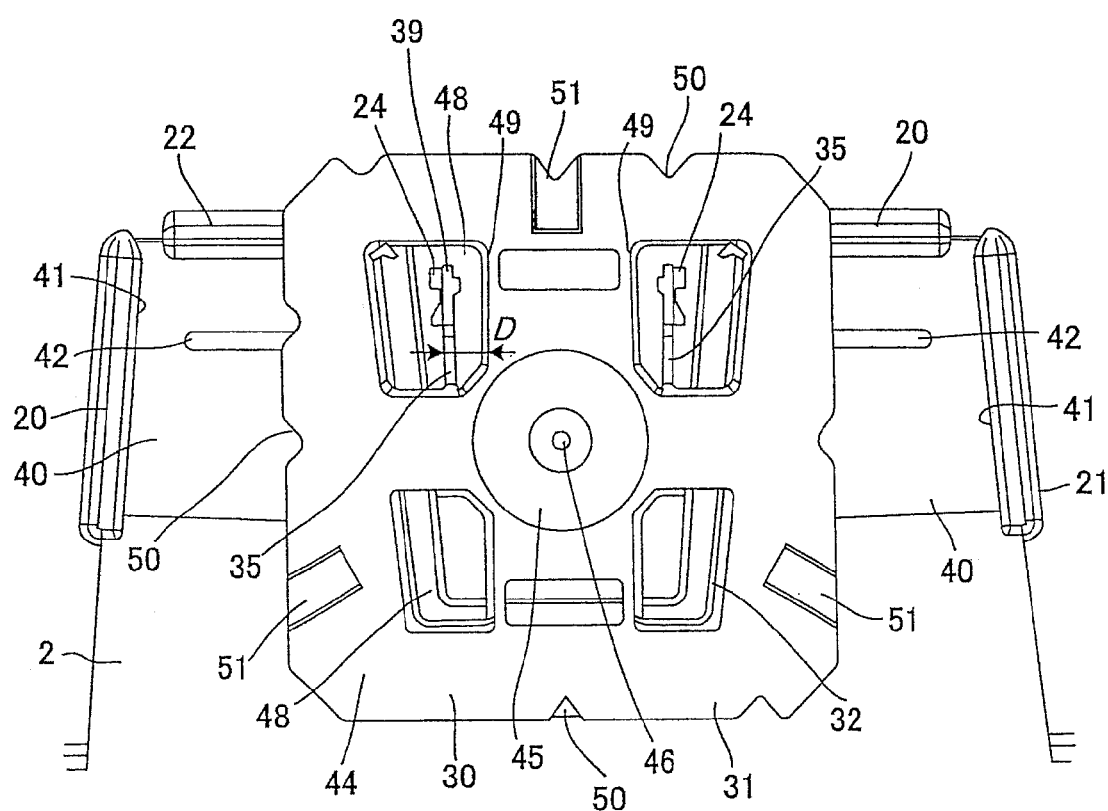
FIG. 3 is an illustrative plan view schematically showing attachment structures and transport components in the embodiment of a substrate storage container according to the present invention.
Figure 4:
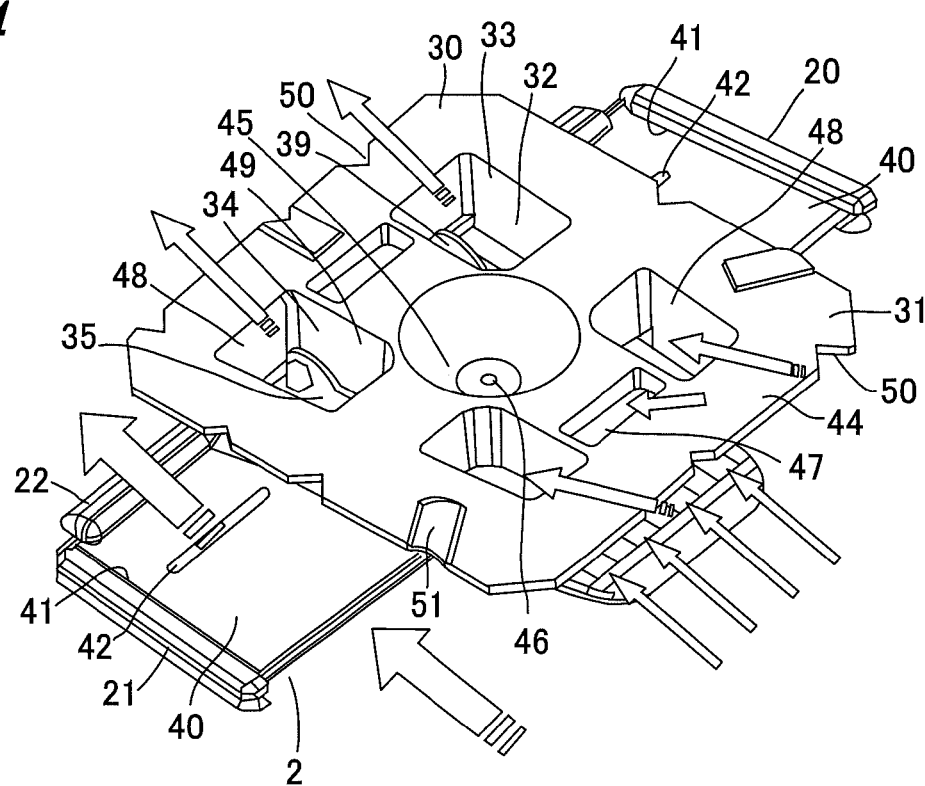
FIG. 4 is an illustrative perspective view schematically showing an attachment structure and a robotic flange, obliquely viewed from the rear side, in the embodiment of a substrate storage container according to the present invention.

As shown in FIGS. 1 and 2, container body 1 is molded into a front open box configuration having an open front with a roof 2 slightly inclined in the vertical direction, and is positioned and mounted on a load port apparatus provided for semiconductor wafer processing equipment. In this container body 1, a pair of left and right supporting pieces that horizontally support a semiconductor wafer are formed in an opposing manner on both the interior sides or the interior surfaces of sidewalls 3, a plurality of the paired supporting pieces being vertically arranged at regular intervals.

Attached to the basal plate of container body 1 at both sides in front and at the center in the rear are positioning members for positioning the substrate storage container, or specifically, the container body 1. The basal plate of container body 1 is attached with a bottom plate that is used for sensing and fixture. The multiple positioning members are exposed through this bottom plate. Formed on the exterior of both sidewalls 3 of container body 1 are manual handles 4 that extend obliquely in the front-to-rear direction and can interfere with fingers and the like.

As shown in FIG. 1, door 10 is composed of a laterally long casing that is fitted into the open front of container body 1, a front plate 11 that covers the open front of the casing and a locking mechanism 13 disposed between the casing and front plate 11. This casing of door 10 is given as an approximately dish-like form with a shallow bottom in section, basically having a frame-like peripheral wall while passage holes for locking mechanism 13 are formed left and right in the top and bottom parts of the peripheral wall so that each passage hole opposes an engagement hole on the front inner periphery of container body 1.

Attached to the rear side of the casing is a removable front retainer that elastically holds semiconductor wafers. This front retainer has a vertically long frame that prevents deformation of door 10. Each of the left and right stiles of this frame is integrally formed with multiple elastic pieces that extend obliquely inward and are arranged vertically. Each elastic piece is integrally formed with a small holding block that holds the front rim of the semiconductor wafer by means of a U-shaped groove or V-groove.

Formed along the periphery on the rear side of the casing is a frame-shaped fitting groove, to which a gasket is closely fitted so as to create pressing contact with the inner periphery of the front of container body 1. This gasket is given in an elastically deformable frame-shaped molding, using, as a molding material, fluoro rubber, silicone rubber or thermoplastic elastomer (e.g., olefin-based, polyester-based, polystyrene-based, etc.) that is excellent in heat resistance and weather resistance and the like.

Front plate 11 is given in the form of a laterally long flat plate corresponding to the open front of the casing and formed on the left and right side with a pair of operation holes 12 for locking mechanism 13. Locking mechanism 13 includes: a pair of rotary plates 14 that are disposed left and right and rotationally operated by operational pins of the load port apparatus that pass through operation holes 12 of front plate 11; a plurality of slide plates that slide upwards and downwards as each rotary plate 14 rotates; and a plurality of retractable engagement claws that are projected through the passage holes of the casing and engaged into the engagement holes of container body 1 as each slide plate slides, and is positioned in front of the front retainer.

Attachment structures 20 are integrally arranged on the outer wall of container body 1, specifically, roof 2 and sidewalls 3 of container body 1. The present embodiment will be described taking a case where attachment structure 20 is disposed on roof 2 of container body 1. Attachment structure 20 in this case is formed of a molding material similar to that of container body 1 or door 10, for example.

Figure 5:
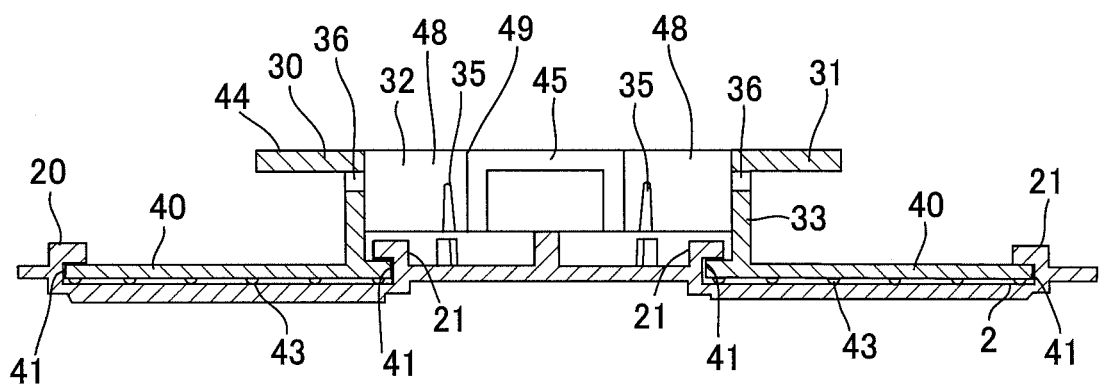
FIG. 5 is an illustrative sectional view schematically showing an attachment structure and a robotic flange in the embodiment of a substrate storage container according to the present invention.
Figure 6:
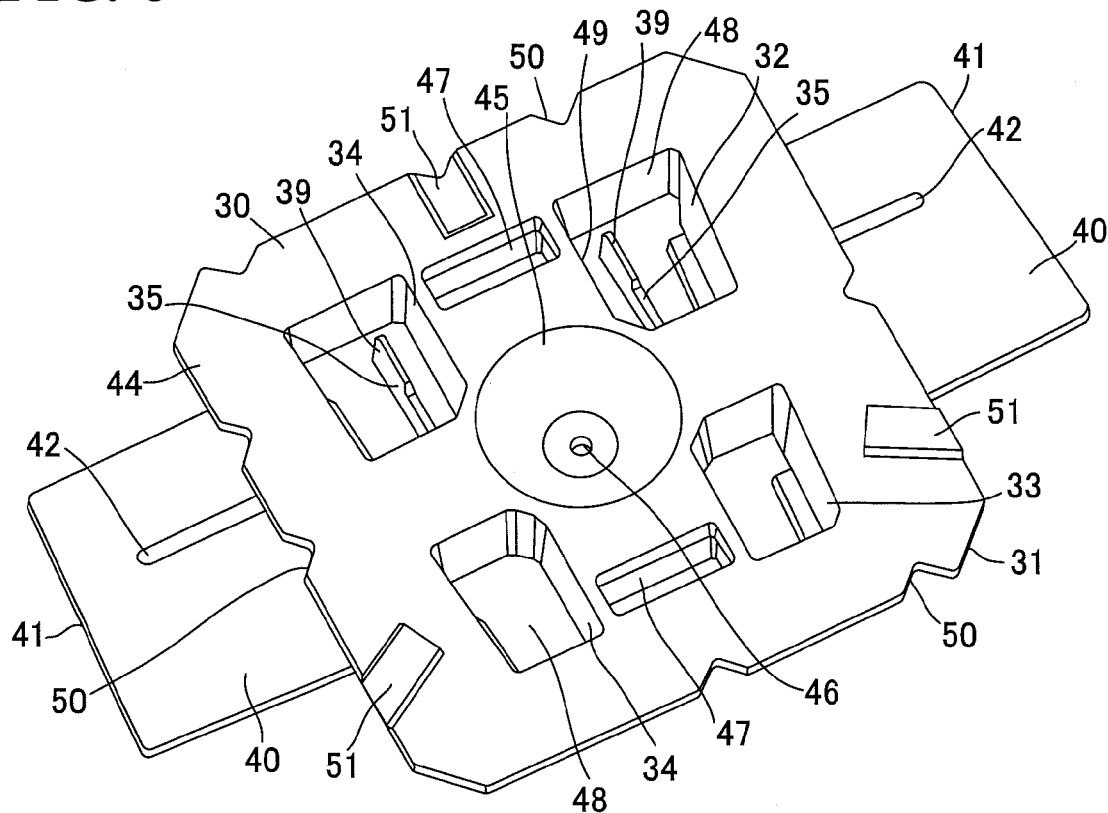
FIG. 6 is an illustrative perspective view schematically showing a robotic flange in the embodiment of a substrate storage container according to the present invention.

As shown in FIGS. 1 to 5, 8 and 9, attachment structure 20 includes a plurality of pairs of left and right supporting rails 21 opposing each other, disposed on both sides on the roof 2 surface of container body 1. Transport component 30 is removably supported between these pairs (e.g., two pairs) of supporting rails 21. These multiple pairs of supporting rails 21, or a pair of supporting rails 21 and another pair of supporting rails 21, different in size and length, are lined up side by side across the surface center of roof 2 of container body 1, as shown in FIGS. 2, 5, etc.

Each pair of supporting rails 21 are arranged opposing each other so that the width between the supporting rails 21 gradually changes (narrows) from the rear (the bottom side in FIG. 2) toward the front (the top side in FIG. 2) of container body 1. Each supporting rail 21 linearly extends in the front-to-rear direction of container body 1 and is flexed so as to have an approximately L-shaped section.

A plurality of stoppers 22 having an approximately L-shaped section and abuts transport component 30 are formed on roof 2 of container body 1, in positions between the front ends of the sidemost supporting rails 21 among the multiple pairs of supporting rails 21 while a pair of left and right guide pieces 23 that extend forward of container body 1 are arranged apart from each other on roof 2 of container body 1, between the multiple stoppers 22. An interference/engagement part 24 is integrally formed on the outerside front part of each guide piece 23.

Figure 9:
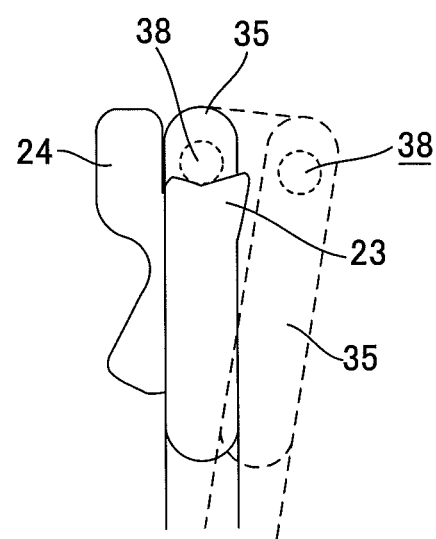
FIG. 9 is an illustrative view schematically showing the relationship of a guide piece and an interference/engagement part in an attachment structure with an elastic engagement piece of a robotic flange in the embodiment of a substrate storage container according to the present invention.

As shown in FIGS. 2 and 9, guide piece 23 and interference/engagement part 24 are combined in a rather deformed, approximate Y-shaped form viewed from top, forming a forked portion 25 in the front. Guide piece 23 is gradually inclined in a direction crossing the front-to-rear direction of container body 1, in other words, toward the center line with respect to the left-to-right direction of container body 1, or more specifically to the direction opposite to interference/engagement part 24. Interference/engagement part 24 is formed shorter than guide piece 23, and is flexed and extended to the forward of container body 1 more than guide piece 23 so as to gradually separate from the distal end of guide piece 23.

Forked part 25 is not particularly limited, but, in view of preventing transport component 30 from easily coming off in the insert direction after its engagement, it is preferable that the forked portion is inclined in the insert direction or formed with a hollow or the like, as shown in FIG. 9. This configuration of forked portion 25 makes it possible to prevent unexpected dislodging of transport component 30 accompanied by an impact.

Though transport component 30 may be selected as appropriate from robotic flange 31, a pair of left and right manual handles 4, a pair of left and right side rails and the like, the present embodiment will be explained as to robotic flange 31 that is removably attached at the center of roof 2 of container body 1 and held by an overhead transport system. This robotic flange 31 is formed of a molding material similar to that of container body 1, door 10 or attachment structure 20, in view of reliably supporting the heavy substrate storage container with a full load of multiple semiconductor wafers.

As shown in FIGS. 1, 3 to 9, robotic flange 31 includes a main part member 32 having a hollowed frame-shape when viewed from top, slid and positioned between multiple pairs of supporting rails 21 of attachment structure 20. A pair of left and right nipped plates 40 that are individually held by paired supporting rails 21 are horizontally extended to both sides from the bottom of this main part member 32 while a horizontal flange 44 to be held by the overhead transport system is integrally formed on the opening top of main part member 32.

Main part member 32 has a peripheral wall 33 on all sides, inside which a plurality of reinforcing ribs 34 integrated with flange 44 to secure strength are disposed right and left and backward and forward. Among these multiple reinforcing ribs 34, the pair of left and right reinforcing ribs 34 located on the front side of container body 1 are each integrally formed with an elastic engagement piece 35 which extends forward and can elastically deform and interfere with guide piece 23 and interference/engagement part 24 of attachment structure 20. Formed in peripheral wall 33 of this main part member 32 are a necessary number of circulation openings 36 that permit fluids, i.e., rinsing water, air (see arrows in FIG. 4) and the like, to pass into and out of main part member 32.

Each reinforcing rib 34 is integrally formed in an L-shape when viewed from top between the inner peripheral wall facets so as to stride over the corner of the peripheral wall of main part member 32, defining an approximately rectangular space when viewed from top, with peripheral wall 33 of main part member 32. This reinforcing rib 34 is formed to be lower than peripheral wall 33 of main part member 32 so as to define a clearance 37 that permits rinsing water and air to pass therethrough. That is, rinsing water and air circulate in and out through clearances 37 and circulation openings 36 of peripheral wall 33.

Each elastic engagement piece 35 has a flexible, approximately linear plate-like configuration and opposes, and is spaced from, reinforcing rib 34 on the side thereof. A cylindrical lock pin 38 that is guided by guide piece 23 of attachment structure 20 to interfere with interference/engagement part 24 of forked portion 25 is integrally formed in the lower part at the distal end of the elastic engagement piece 35. A handle piece 39 projected upward for handling is integrally formed in a semicircular shape in the upper part of elastic engagement piece 35.

Each nipped plate 40 is basically given as a flat plate that overlaps the roof 2 surface of container body 1 with its lateral sides 41 gradually inclined so as to go along the inclination of supporting rains 21, whereby the nipped plate removably engages supporting rails 21 as it is slid from the rear to front of container body 1 and fits and engages with stopper 22 so as not to slide further than needed. This nipped plate 40 is formed with a circulation opening 42 having an approximately oval form when viewed from top for circulating rinsing water and air, and has multiple indented portions 43 laid out on the underside in the front and both lateral parts thereof. These indented portions 43 define multiple gaps from roof 2 of container body 1 to circulate rinsing water and air.

Here, multiple indented portions 43 may also be formed as appropriate on the underside of peripheral wall 33 of main part member 32 as required, other than the underside of nipped plate 40.

Flange 44 basically has a rectangular shape when viewed from top with its four corners beveled, has a hollow part 45 for screw fixing in the center thereof and is sensed or positioned by the overhead transport system. Hollow part 45 is given in an approximately frustoconical shape and integrated with the flexed parts of multiple reinforcing ribs 34. A screw hole 46 is formed in the thickness direction at the center of the hollow part. A fastening member such as a screw or the like is screwed through this screw hole 46 from above and screw-inserted into a screw hole 5 at the center of the roof of container body 1 to thereby fix robotic flange 31.

Arranged in flange 44 are a plurality of circulation openings 47 and square openings 48 that connect to main part member 32. Of the multiple square openings 48, the pair of left and right square openings 48 located in the front side of container body 1 expose elastic engagement pieces 35 in a visible and operable manner. This exposed elastic engagement piece 35 flexes and deforms in a direction perpendicular to the sliding direction of robotic flange 31, or in the left-and-right direction of container body 1 as guide piece 23 of attachment structure 20 comes into contact with the elastic engagement piece, and the range of flexing is limited within the distance D to inner side edge 49 that defines square opening 48 (see FIG. 3).

Formed on the all side of the peripheral part of flange 44 extended beyond peripheral wall 33 of main part member 32 are a plurality of V-notches 50 for positioning. Further, a plurality of curved grooves 51 are formed at intervals on the front, left and right sides on the top surface of flange 44.

With the above configuration, when robotic flange 31 as transport component 30 is attached to attachment structure 20 of container body 1, robotic flange 31 is placed in the rear of roof 2 of container body 1, and is slid toward the front of container body 1 with nipped plates 40 of robotic flange 31 held between respective pairs of supporting rails 21 of attachment structure 20, until the front ends of nipped plates 40 of robotic flange 31 are stopped by respective stoppers 22, whereby upward dislodging of robotic flange 31 is prevented.

At this point, multiple pairs of supporting rails 21 of attachment structure 20 are inclined with respect to the front-to-rear direction of container body 1, so that it is possible to prevent positional displacement and backlashing of robotic flange 31 relative to container body 1 with a simple configuration. Accordingly, it is possible to appropriately slide robotic flange 31 to the predetermined position. The lateral sides 41 of nipped plates 40 of robotic flange 31 are also inclined correspondingly to the inclination of supporting rails 21, so that there is no risk of robotic flange 31 being set in a wrong orientation.

When robotic flange 31 slides forward as shown in FIG. 9, elastic engagement pieces 35 of robotic flange 31 come into sliding contact with a pair of inclined guide pieces 23 of attachment structure 20 and are guided thereby. The paired elastic engagement pieces 35 flex and deform in directions different from each other, or specifically, inwards with respect to the lateral direction of container body 1, then each elastic engagement piece 35 passes over the front part of guide piece 23 and places lock pin 38 to forked portion 25 between guide piece 23 and interference/engagement part 24, or makes the lock pin interfere with interference/engagement part 24 located outside.

Figure 7:
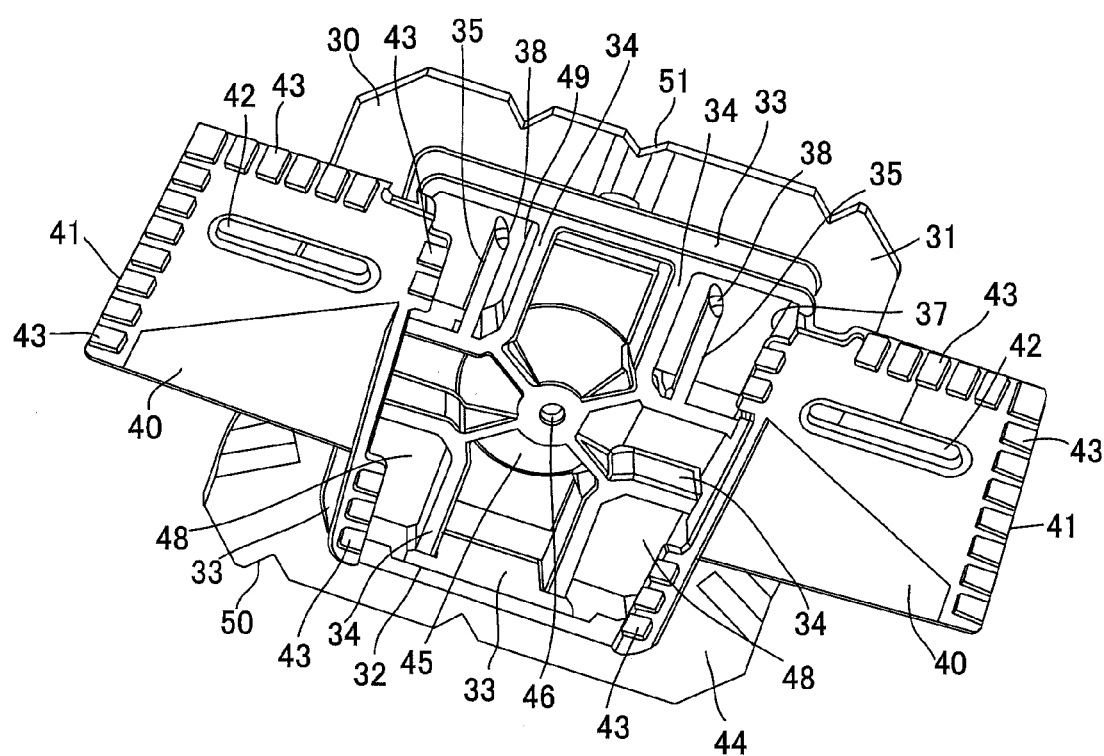
FIG. 7 is an illustrative perspective view schematically showing a robotic flange, viewed from the underside thereof, in the embodiment of a substrate storage container according to the present invention.
Figure 8:
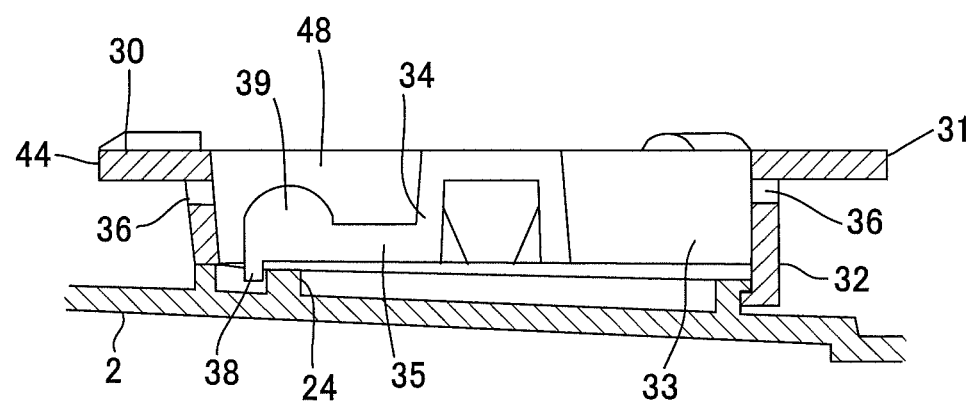
FIG. 8 is a side sectional view schematically showing a robotic flange in the embodiment of a substrate storage container according to the present invention.

At this point, if elastic engagement piece 35 tries to excessively flex and deform inwards of container body 1, the elastic engagement piece comes in contact with the adjacent reinforcing rib 34 so that its deformation is limited (see FIG. 7). Accordingly, it is possible to efficiently prevent damage due to excessive deformation of elastic engagement piece 35. As lock pin 38 interferes with, and engages, interference/engagement part 24 of each forked portion 25, flexed elastic engagement pieces 35 each revert back to their original state, whereby it is possible to robustly attach robotic flange 31 to attachment structure 20 of container body 1.

Next, when robotic flange 31 attached to attachment structure 20 of container body 1 is removed, handle piece 39 of each elastic engagement piece 35 is pushed toward the inner side edge 49 of square opening 48 with a finger by inserting the finger from above through square opening 48 of robotic flange 31 so as to flex and deform the elastic engagement piece 35 inward with respect to the lateral direction of container body 1 and thereby release interference between interference/engagement part 24 and lock pin 38.

After interference of interference/engagement part 24 with lock pin 38 is released, robotic flange 31 is slid rearwards of container body 1 and the interlocked relationship between multiple pairs of supporting rails 21 and nipped plates 40 of robotic flange 31 is released. As a result, robotic flange 31 can be detached from attachment structure 20 of container body 1.

According to the above configuration, it is possible to remove the robotic flange by simply pressing handling pieces 39 of elastic engagement pieces 35 toward inner side edges 49 of square openings 48 to flex to deform elastic engagement pieces 35 inwards with respect to the lateral direction of container body 1, so that it is no longer necessary to apply strong external force to elastic engagement pieces 35 and deform them by force. Accordingly, it is possible to markedly improve operability of the detachment work of robotic flange 31 from attachment structure 20.

Further, since the amount of flexion of elastic engagement piece 35 is so small that it is possible to effectively eliminate the risk of elastic engagement piece 35 being deformed and becoming likely to come off from the attachment structure even if elastic engagement piece 35 is attached and detached a multiple number of times. Further, since handle piece 39 of elastic engagement piece 35 is operated by the finger inserted through square opening 48 so as to flex elastic engagement piece 35, there is hardly any case in which operation is hindered, hence never leading to lowering of work performance and operability.

Further, since main part member 32, paired nipped plates 40 and flange 44 of robotic flange 31 are formed with multiple circulation openings 36, 42 and 47, respectively while multiple indented portions 43 are formed in each nipped plate 40, there are little occasions in which rinsing water is left over and/or ventilation of drying air lowers even if container body 1 of the substrate storage container is washed with rising water. Accordingly, it is possible to dry container body 1 in a short time.

Further, since the risk of rising water remaining in container body 1 is extremely low, it is possible to inhibit or prevent traces of waterdrops from being left over and volatile organic gases from arising from the molding material of container body 1 and adhering to the semiconductor wafers. Moreover, it is possible to eliminate the fear of generation of salts of organic compounds yielding staining and the cause of corrosion.

Figure 10:
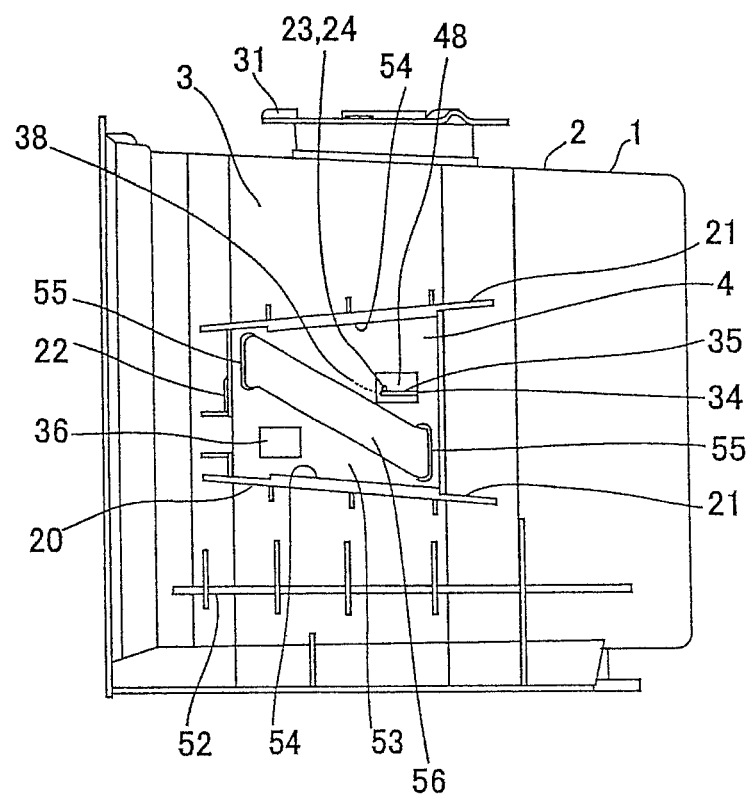
FIG. 10 is an illustrative side view schematically showing the second embodiment of a substrate storage container according to the present invention.

Next, FIG. 10 shows the second embodiment of the present invention. In this case, attachment structure 20 and side rail 52 are arranged apart at top and bottom on the exterior of either sidewall 3 of container body 1, so that a manual handle 4 as transport component 30 is removably attached to each attachment structure 20.

Each attachment structure 20 includes a pair of top and bottom supporting rails 21 arranged on the sidewall 3 surface of container body 1 and opposing each other. A transport component 30 is removably supported between this pair of supporting rails 21. This pair of supporting rails 21 are arranged opposing each other so that the width between the supporting rails 21 gradually narrows from the rear toward the front of container body 1. Each supporting rail 21 linearly extends in the front-to-rear direction of container body 1 and flexed so as to have an approximately L-shaped section.

Guide pieces 23 that extend forward of container body 1 are arranged apart on the sidewall 3 surface of container body 1, between paired supporting rails 21 while an interference/engagement part 24 is integrally formed in the front part on the outer side of guide piece 23. Guide piece 23 and interference/engagement part 24 are combined in a rather deformed, approximate Y-shaped form when viewed from top, forming a forked portion 25 in the front. Guide piece 23 is gradually inclined in a direction crossing the front-to-rear direction of container body 1, in other words, in a vertical direction opposite to interference/engagement part 24.

Here, appropriately formed at intervals on each sidewall 3 of container body 1 may be a plurality of stoppers 22 that have an approximately L-shaped section and engage the front end of manual handle 4.

Manual handle 4 includes a main part member 53 having an approximately trapezoidal form when viewed from top and slid along and between paired supporting rails 21 of attachment structure 20 and positioned from the rear (the right side in FIG. 10) forwards of container body 1. An elastically deformable, elastic engagement piece 35 is integrally formed at the rear end part on the underside of this main part member 53 by means of reinforcing rib 34. This elastic engagement piece 35 extends forwards and interferes with guide piece 23 and interference/engagement part 24 of attachment structure 20.

Main part member 53 is given as, for example a plate having an approximately hat-shaped section and opposing sidewall 3 of container body 1 with its both side surfaces 54 gradually inclined along the inclination of supporting rails 21. A circulation opening 36 that permits rinsing water and air to circulate is formed in the front part while a square opening 48 that exposes elastic engagement piece 35 in a visible and operable manner, is formed in the rear part. Formed in the front and rear on the outer surface of this main part member 53 are a pair of supporters 55, between which a handling grip 56 is supported.

A plurality of indented portions 43 are selectively arranged on the side parts on the underside of main part member 53.

These multiple indented portions 43 define multiple gap with sidewall 3 of container body 1 for circulating rinsing water and air. Further, elastic engagement piece 35 has a flexible, approximately linear plate-like configuration and opposes, and is spaced from, reinforcing rib 34. A cylindrical lock pin 38 that is guided by guide piece 23 of attachment structure 20 to interfere with interference/engagement part 24 is integrally formed in the lower part at the distal end of the elastic engagement piece. A projected handle piece 39 for handling is optionally formed in the upper part of elastic engagement piece 35.

Here, reinforcing rib 34 may be integrally formed in an approximately #-like shape, approximately I-shape, approximately H-shape, approximately L-shape, approximately T-shape or the like, in the rear on the underside of main part member 53 while at least part of the rib should oppose and be spaced from, the lateral side of elastic engagement piece 35.

With the above configuration, when manual handle 4 as transport component 30 is attached to attachment structure 20 of container body 1, manual handle 4 is placed in the rear of sidewall 3 of container body 1, and is slid toward the front of container body 1 with main part member 53 of manual handle 4 held between paired supporting rails 21 of attachment structure 20, to thereby prevent manual handle 4 from dislodging.

At this point, paired supporting rails 21 of attachment structure 20 are inclined, so that it is possible to appropriately slide manual handle 4 to the predetermined position. Further, both side surfaces 54 of main part member 53 are also inclined correspondingly to the inclination of supporting rails 21, so that there is no risk of manual handle 4 being set in a wrong orientation.

When manual handle 4 slides forwards, elastic engagement pieces 35 of manual handle 4 come into sliding contact with inclined paired guide pieces 23 of attachment structure 20 and are guided thereby. The elastic engagement piece 35 flexes and deforms in the vertical direction of container body 1, then elastic engagement piece 35 passes over the front part of guide piece 23 and places lock pin 38 to forked portion 25 between guide piece 23 and interference/engagement part 24, or makes the lock pin interfere with interference/engagement part 24.

At this point, if elastic engagement piece 35 tries to flex and deform excessively, the elastic engagement piece comes in contact with the adjacent reinforcing rib 34 so that its deformation is limited. Accordingly, it is possible to efficiently prevent damage due to excessive deformation of elastic engagement piece 35. As lock pin 38 interferes with, and engages, interference/engagement part 24 of forked portion 25, flexed elastic engagement piece 35 reverts back to its original state, whereby it is possible to robustly attach manual handle 4 to attachment structure 20 of container body 1.

Next, when manual handle 4 attached to attachment structure 20 of container body 1 is removed, elastic engagement piece 35 is operated with a finger by inserting the finger through square opening 48 of manual handle 4 so as to flex and deform the elastic engagement piece 35 in the vertical direction of container body 1 and thereby release interference between interference/engagement part 24 and lock pin 38.

After interference of interference/engagement part 24 with lock pin 38 is released, manual handle 4 is slid rearwards of container body 1 and the interlocked relationship between paired supporting rails 21 and manual handle 4 is released. As a result, manual handle 4 can be detached from attachment structure 20 of container body 1. Other components function in approximately the same manner as in the above embodiment, so that description is omitted.

Also in this embodiment, the same operation and effect as that in the above embodiment can be expected, and it is obvious that the configurations of attachment structure 20 and transport component 30 can be diversified.

In addition, attachment structures 20 may be arranged in the lower part on either sidewall 3 of container body 1 in the above embodiment while a side rail 52 may be removably attached as transport component 30 to each attachment structure 20. Further, a pair of left and right fitting grooves may be cut out in the front-to-rear direction on the roof 2 surface of container body 1 between multiple pairs of supporting rails 21 while a fitting piece that fits into each fitting groove on roof 2 may be formed in the bottom end of peripheral wall 33 of main part member 32. Moreover, though, in the above embodiments, supporting rail 21 of attachment structure 20 is formed so as to have an approximately L-shaped section, supporting rail 21 may be formed by bending so as to have an approximately J-shaped or T-shaped section.

Attachment structure 20 may have only one supporting rail 21, or three, four, or an increased number of rails as appropriate. Further, grooves having an approximately L-shaped section, an approximately J-shaped section or an approximately T-shaped section may be formed on roof 2 or sidewalls 3 of container body 1 so as to use these grooves as supporting rail portions. To deal with this, main part member 32, 53 or nipped plate 40 of transport component 30 may be provided with a projected portion so that the projected portion can removably fit to the supporting rail portion. It is also possible to shape guide piece 23 of attachment structure 20 into an inverse-tapered form with respect to the direction in which lock pin 38 of transport component 30 comes off. Furthermore, main part members 32, 53 of transport component 30 may be formed in an annular configuration, etc., other than frame-like, plate-like configurations.

INDUSTRIAL APPLICABILITY

The substrate storage container of the present invention can be used in the field of manufacturing liquid crystal, semiconductor and the like.

DESCRIPTION OF REFERENCE NUMERALS 1 container body
2 roof (outer wall)
3 sidewall (outer wall)
4 manual handle (transport component)
10 door
20 attachment structure
21 supporting rail (supporting rail portion)
22 stopper
23 guide piece
24 interference/engagement part
25 forked portion
30 transport component
31 robotic flange (transport component)
32 main part member
33 peripheral wall
34 reinforcing rib (deformation restrainer)
35 elastic engagement piece
36 circulation opening
37 clearance
38 lock pin (projected portion)
39 handle piece
40 nipped plate
41 lateral side
42 circulation opening
43 indented portion
44 flange
47 circulation opening
48 square opening (operational opening)
49 inner side edge
52 side rail (transport component)
53 main part member
54 side surface

The invention claimed is:

1. A substrate storage container comprising:
   an attachment structure in a container body for storing substrates so that a transport component is removably attached to the attachment structure,
   wherein the attachment structure-comprises:
      a supporting rail portion provided on an outer wall of the container body;
      a guide piece provided on the outer wall of the container body; and
      an engagement part formed with the guide piece, forming a forked portion of a combination of the guide piece and the engagement part, and
   wherein the transport component comprises:
      a hollowed frame-shape main part member supported by the supporting rail portion of the attachment structure,
      wherein the hollowed frame-shape main part member is formed with circulation openings in a peripheral wall for fluids and an elastic engagement piece to be guided by the guide piece of the attachment structure,
      wherein the elastic engagement piece being made to interfere with the forked portion of the guide piece and the engagement part of the attachment structure.

2. The substrate storage container according to claim 1, wherein the attachment structure includes a stopper that engages the transport component.

3. The substrate storage container according to claim 1,
   wherein the container body is a box having an open front,
   wherein the guide piece of the attachment structure is oriented in a front to rear direction of the container body and formed with the engagement part on a side surface the guide piece while the guide piece is inclined in the direction crossing the front-to-rear direction of the container body,
   wherein the elastic engagement piece of the transport component is formed to be flexible so as to flex and come into contact with the guide piece of the attachment structure, and
   wherein the elastic engagement piece being formed with a projected portion that interferes with the engagement part of the attachment structure.

4. The substrate storage container according to claim 3,
   wherein a plurality of supporting rail portions are provided for the attachment structure and arranged as pairs,
   wherein the opposing multiple supporting rail portions are each inclined so that the distance between the pairs of supporting rail portions becomes shorter from the rear to the front of the container body,
   wherein the guide piece of the attachment structure is provided between the multiple supporting rail portions so as to be inclined with respect to a center line with respect to a lateral direction of the container body,
   wherein the hollowed frame-shape main part member of the transport component is made hollow so as to incorporate the elastic engagement piece therein,
   wherein nipped plates to be held between multiple supporting rail portions of the attachment structure are formed on both sides of the hollowed frame-shape main part member, wherein the side surface of each nipped plate is inclined so as to fit along the inclination of a pair of supporting rail portions while a flange is formed on the top of the hollowed frame-shape main part member, wherein the flange being provided with an operational opening through which the elastic engagement piece is exposed, and wherein another circulation opening for circulating fluids is provided in, at least, either one of multiple nipped plates and the flange.

5. The substrate storage container according to claim 3, wherein a plurality of supporting rail portions are provided for the attachment structure and arranged as pairs, wherein the opposing multiple supporting rail portions are each inclined so that the distance between the supporting rail portions becomes shorter from the rear to the front of the container body, wherein the guide piece of the attachment structure is provided between the multiple supporting rail portions so as to be inclined to a vertical direction of the container body, wherein the hollowed frame-shape main part member of the transport component is shaped into an approximately trapezoidal plate having both lateral sides inclined so as to fit along the inclination of the supporting rail portions while an elastic engagement piece is formed in the underside of the main part member, and wherein an operational opening is provided for the hollowed frame-shape main part member to expose the elastic engagement piece.

6. The substrate storage container according to claim 1, wherein an indented portion that defines a clearance with the outer wall of the container body is formed on the underside of, at least, either one of the hollowed frame-shape main part member and a nipped plate, and wherein the hollowed frame-shape main part member is formed with a deformation restrainer for limiting excessive deformation of the elastic engagement piece due to contact with the guide piece of the attachment structure.

* * * * *